United States Patent [19]

Sakamoto

[11] Patent Number: 5,734,177
[45] Date of Patent: Mar. 31, 1998

[54] SEMICONDUCTOR DEVICE, ACTIVE-MATRIX SUBSTRATE AND METHOD FOR FABRICATING THE SAME

[75] Inventor: Hiromi Sakamoto, Kashiba, Japan

[73] Assignee: Sharp Kabushiki Kaisha, Osaka, Japan

[21] Appl. No.: 717,463

[22] Filed: Sep. 20, 1996

[30] Foreign Application Priority Data

Oct. 31, 1995 [JP] Japan .................................. 7-284155

[51] Int. Cl.⁶ .................. H01L 129/72; H01L 21/265; G02F 1/137
[52] U.S. Cl. .................. 257/49; 257/88; 257/98; 257/99; 257/368; 257/390; 257/750; 257/758; 257/773; 257/296; 349/46; 349/47; 349/38; 438/40; 438/48; 438/181
[58] Field of Search .................. 257/49, 88, 98, 257/99, 368, 390, 750, 758, 773, 296; 349/46, 47, 38; 438/40, 48, 181

[56] References Cited

U.S. PATENT DOCUMENTS 5,530,266  6/1996  Yonehara et al. .................. 257/347

FOREIGN PATENT DOCUMENTS 3-269521  12/1991  Japan .
4-178634   6/1992  Japan .
5-53139    3/1993  Japan .
6-160901   6/1994  Japan .

Primary Examiner—Edward Wojciechowicz
Attorney, Agent, or Firm—Nixon & Vanderhye P.C.

[57] ABSTRACT

A semiconductor device formed on an insulating substrate of the present invention includes: a gate wiring provided on the insulating substrate; a first insulating film provided so as to cover the gate wiring; an upper electrode formed so as to face the gate wiring in such a manner that the first insulating film is interposed therebetween; a second insulating film provided so as to cover the upper electrode; and another electrode formed on the second insulating film, wherein the upper electrode is electrically connected to the another electrode via a contact hole formed through the second insulating film, a storage capacitor is formed of a structure including the upper electrode, the first insulating film, and the gate wiring opposing the upper electrode through the first insulating film, the upper electrode and the gate wiring have substantially the same width.

23 Claims, 10 Drawing Sheets

↑ ↑ ↑ Exposure 5,734,177

1

SEMICONDUCTOR DEVICE, ACTIVE-MATRIX SUBSTRATE AND METHOD FOR FABRICATING THE SAME

BACKGROUND OF THE INVENTION

1. Field of the Invention

The present invention relates to a semiconductor device and an active-matrix substrate having a storage capacitor for use in a liquid crystal display apparatus or the like. The present invention also relates to a method for fabricating such an active-matrix substrate.

2. Description of the Related Art

As a liquid crystal display apparatus, an active-matrix type liquid crystal display apparatus is conventionally known. In the active-matrix type liquid crystal display apparatus, switching elements such as Thin Film Transistors (TFTs) or Metal Insulator Metal (MIM) elements are formed in a matrix on a transparent insulating substrate such as a glass substrate. Recently, the active-matrix type liquid crystal display apparatus is provided with a display screen of larger size and higher precision. In order to improve the reliability of the active-matrix type liquid crystal display apparatus so as to comply with the large-sized display screen and high precision, it is necessary to form a corresponding storage capacitor for each pixel.

FIGS. 8 and 9 show an example of an active-matrix substrate including a storage capacitor. FIG. 8 is a plan view showing the active-matrix substrate, and FIG. 9 is a cross-sectional view taken along a line 9a—9a in FIG. 8.

The structure of the active-matrix substrate is as follows. A semiconductor island 3 is formed on a transparent insulating substrate 1. On the semiconductor island 3, an $SiO_2$ film is formed as a gate insulating film 4. On the gate insulating film 4, an alloy film containing Al as a main component, a Ta film or the like is deposited so as to form a gate wiring 6, a gate electrode 5 and a storage capacitor wiring 27. P ions or B ions are implanted into the semiconductor layer 3 so as to form a source region 8 and a drain region 9 by using the gate electrode 5 as a mask. Since the gate electrode 5 is used as a mask for ion implantation, ions are not implanted into a region below the gate electrode 5. As a result, the region serves as a channel region 3C. An $SiO_2$ film is formed as an interlayer insulating film 13 on the gate electrode 5, the storage capacitor wiring 27 and the gate insulating film 4. Then, contact holes 14 and 15 are formed through the interlayer insulating film 13 and the gate insulating film 4. A source wiring 17 and a drain electrode 18 are respectively formed on the contact holes 14 and 15 by sputtering an alloy containing Al as a main component or the like. The source wiring 17 and the drain electrode 18 are connected to the source region 8 and the drain region 9 via the contact holes 14 and 15, respectively. A pixel electrode 23 made of Indium Tin Oxide (ITO) is formed on part of the interlayer insulating film 13 formed on the storage capacitor wiring 27 and part of the drain electrode 18, and is connected to the drain electrode 18. Part of the pixel electrode 23 overlapping the storage capacitor wiring 27 serves as a storage capacitor.

Other various methods for forming the storage capacitor are also known. For example, according to a method disclosed in Japanese Laid-Open Patent Publication No. 4-178634, a gate electrode material such as Ta is used as a material of a lower electrode of a storage capacitor. By anodizing the surface of the lower electrode, a Ta oxide film is formed. On the Ta oxide film, an upper electrode of a storage capacitor is formed by using the same material as

2 that of the source wiring and the drain electrode. Japanese Laid-Open Patent Publication No. 3-269521 discloses a method for disposing a storage capacitor electrode connected to a gate wiring and a transparent pixel electrode so as to face each other in such a manner that an anodic oxide film is interposed therebetween. Furthermore, according to a method disclosed in a Japanese Laid-Open Patent Publication No. 6-160901, an interlayer insulating film is formed over the entire insulating substrate on which TFTs are formed, so that a pixel electrode extends over a gate wiring. The width of the gate wiring is partially increased, thereby forming a storage capacitor without independently forming a storage capacitor electrode.

With the aforementioned structure shown in FIGS. 8 and 9, the gate wiring and the lower electrode of the storage capacitor can be formed in the same fabrication step. However, since the lower electrode of the storage capacitor is formed in a region separated from the gate wiring, the aperture ratio is lowered by the region where the lower electrode is formed. Moreover, since the interlayer insulating film is used as a dielectric of a storage capacitor, the interlayer insulating film has a large thickness. Therefore, an area for the storage capacitor should be large so as to obtain a sufficient capacitance, which results in a low aperture ratio. A method for providing a lower electrode of the storage capacitor below the gate wiring so as to interpose a gate insulating film therebetween may also be possible. In this case, however, it is necessary to take an alignment margin between the gate wiring and the lower electrode into consideration. Therefore, this method also results in a low aperture ratio.

In Japanese Laid-Open Patent Publication No. 4-178634, an anodic oxide film made of a gate electrode material is used as a dielectric of a storage capacitor. However, an upper electrode of the storage capacitor is formed from the same layer as the source wiring and the drain electrode. Moreover, a lower electrode of the storage capacitor is formed in a region separate from the gate wiring. Therefore, it is difficult to improve an aperture ratio.

In Japanese Laid-Open Patent Publication No. 3-269521, a transparent electrode is used as an upper electrode of a storage capacitor. However, since the upper electrode is connected to the gate wiring and is formed separately from the lower electrode of the storage capacitor, an aperture ratio is lowered.

In Japanese Laid-Open Patent Publication No. 6-160901, the storage capacitor is formed on the gate wiring without independently forming the lower electrode of the storage capacitor. However, since the pixel electrode is extended over the gate wiring, it is necessary to take the alignment margin into consideration. Moreover, since the width of the gate wiring is partially increased, the aperture ratio is lowered.

In this manner, if the storage capacitor is formed in the conventional semiconductor device, a large aperture ratio cannot be obtained. Therefore, if such a semiconductor device is used in a liquid crystal display apparatus or the like, bright display is difficult to obtain.

It is preferred that a semiconductor apparatus has a low wiring resistance. For example, it is assumed that a six-inch VGA for portable data terminal has a line width of 3 μm and a line thickness of 0.5 μm in 256 gray-scale display. Even when a four-phase driving method is used in such a VGA, a time constant is 160 nsec. Calculated from a capacitance on a source wiring, a specific resistance of the wiring should be at about 10 μΩcm or smaller. In particular, in an active-matrix type liquid crystal display apparatus which is provided with a display screen of larger size and higher precision, a delay of a signal cannot be negligible. Therefore, it is more strongly desired to lower the wiring resistance.

Conventionally, an Al type material has been mainly used as a wiring material having a low resistance. In the case where an anodic oxide film made of an Al type material is used as a dielectric of the storage capacitor, a dielectric constant of $Al_2O_3$ becomes higher than that of $SiO_2$. However, an anodic oxide film made of pure Al or Al—Si has a low dielectric strength and a large amount of leak current, the reliability of a semiconductor material using the storage capacitor made of such a material is disadvantageously lowered.

SUMMARY OF THE INVENTION

A semiconductor device formed on an insulating substrate of the present invention includes: a gate wiring provided on the insulating substrate; a first insulating film provided so as to cover the gate wiring; an upper electrode formed so as to face the gate wiring in such a manner that the first insulating film is interposed therebetween; a second insulating film provided so as to cover the upper electrode; and another electrode formed on the second insulating film, wherein the upper electrode is electrically connected to the another electrode via a contact hole formed through the second insulating film, a storage capacitor is formed of a structure including the upper electrode, the first insulating film, and the gate wiring opposing the upper electrode across the first insulating film, the upper electrode and the gate wiring have substantially the same width.

In another embodiment of the invention, the insulating substrate, the upper electrode and the first insulating film are transparent.

In still another embodiment of the invention, the upper electrode is patterned by exposure from a bottom face of the substrate using the gate wiring as a mask.

In still another embodiment of the invention, the first insulating film has a thickness in the range of about 50 nm to about 200 nm.

In still another embodiment of the invention, the first insulating film has a thickness in the range of about 50 nm to about 300 nm.

In still another embodiment of the invention, a metal material for forming the gate wiring has a specific resistance of 10 µΩcm or less.

In still another embodiment of the invention, the gate wiring is made of a metal material containing Al as a main component.

In still another embodiment of the invention, the metal material containing Al as a main component contains at least one of Ti, Dy, Nd, Fe, Co and Gd.

In still another embodiment of the invention, the first insulating film includes a film formed by anodizing a surface of the gate wiring.

According to another aspect of the invention, an active matrix substrate includes: an insulating substrate; a gate wiring provided on the insulating substrate; a source wiring intersecting the gate wiring; a pixel electrode for applying a voltage to a display medium, provided in the vicinity of an intersecting point of the gate wiring and the source wiring; a switching element electrically connected to the pixel electrode; a first insulating film provided so as to cover the gate wiring; an upper electrode formed so as to face the gate wiring in such a manner that the first insulating film is interposed therebetween; and a second insulating film formed so as to cover the upper electrode, wherein the upper electrode is electrically connected to the pixel electrode via a contact hole formed through the second insulating film, a storage capacitor for holding a voltage to be applied to the display medium is formed of a structure including the upper electrode, the first insulating film and the gate wiring opposing the upper electrode across the first insulating film, and the upper electrode and the gate wiring have substantially the same width.

According to still another aspect of the invention, an active-matrix substrate includes: an insulating substrate; a first gate wiring and a second gate wiring provided on the insulating substrate; a source wiring intersecting the first gate wiring and the second gate wiring; a pixel electrode for applying a voltage to a display medium, provided in the vicinity of an intersecting point of the first gate wiring and the source wiring between the first gate wiring and the second gate wiring; a switching element including a gate electrode connected to the first gate wiring, a source electrode connected to the source wiring, and a drain electrode electrically connected to the pixel electrode; a first insulating film provided so as to cover the second gate wiring; an upper electrode formed so as to face the second gate wiring in such a manner that the first insulating film is interposed therebetween; and a second insulating film provided so as to cover the upper electrode, wherein the upper electrode is electrically connected to the pixel electrode via a contact hole formed through the second insulating film, a storage capacitor for holding a voltage to be applied to the display medium is formed of a structure including the upper electrode, the first insulating film and the second gate wiring opposing the upper electrode across the first insulating film, and the upper electrode and the second gate wiring have substantially the same width.

According to another aspect of the invention, a method for fabricating an active-matrix substrate including: a transparent insulating substrate; a gate wiring provided on the transparent insulating substrate; a source wiring intersecting the gate wiring; a pixel electrode for applying a voltage to a display medium, provided in the vicinity of an intersecting point of the gate wiring and the source wiring; and a switching element electrically connected to the pixel electrode, the method includes the steps of: forming a first transparent film so as to cover the gate wiring; forming a transparent conductive film so as to cover the first transparent insulating film; patterning the transparent conductive film in a self-aligned manner with the gate wiring by photolithography using the gate wiring as a mask, thereby forming an upper electrode so as to face the gate wiring in such a manner that the first transparent insulating film is interposed therebetween; forming a second insulating film having a contact hole formed therethrough so as to cover the upper electrode; and forming the pixel electrode, which is electrically connected to the upper electrode via the contact hole formed through the second insulating film, on the second insulating film, wherein a storage capacitor for holding a voltage to be applied to the display medium is formed of a structure including the upper electrode, the first transparent insulating film and the gate wiring opposing the upper electrode across the first transparent insulating film.

In one embodiment of the invention, the first transparent film is formed by anodizing a surface of the gate wiring.

In another embodiment of the invention, the first transparent film is formed so as to have a thickness in the range of about 50 nm to about 200 nm.

Thus, the invention described herein makes possible the advantages of providing: (1) a semiconductor device and an active-matrix substrate having a large aperture ratio and excellent reliability; and (2) a method for fabricating such an active-matrix substrate.

These and other advantages of the present invention will become apparent to those skilled in the art upon reading and understanding the following detailed description with reference to the accompanying figures.

DESCRIPTION OF THE PREFERRED EMBODIMENTS

Figure 1:
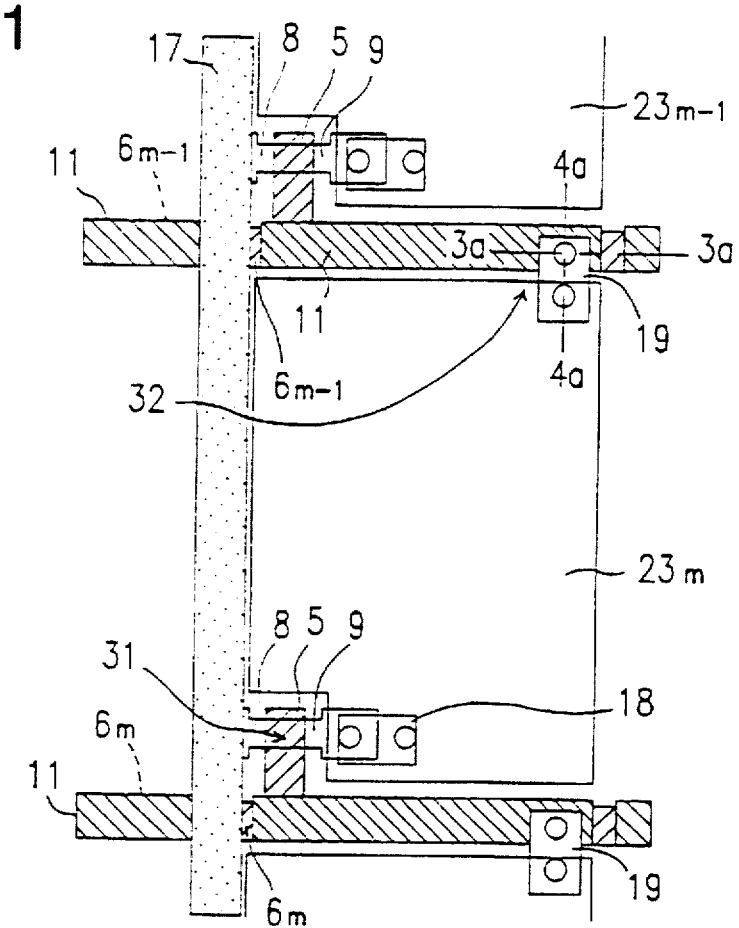
FIGS. 1 is a plan view showing an active-matrix substrate of Example 1 of the present invention.

In a semiconductor device according to the present invention, a transparent electrode is formed on a gate wiring so as to interpose a transparent insulating film therebetween. An overlapping portion of the gate wiring, the transparent insulating film and the transparent electrode serves as a storage capacitor for holding a voltage to be applied to a display medium.

A transparent conductive film such as ITO or another transparent conductive film made of ZnO or the like can be used as a transparent electrode constituting a storage capacitor. Since both the dielectric and the upper electrode are transparent, the transparent electrode can be formed by depositing a transparent conductive film in the following manner. A transparent insulating film is formed on a gate wiring. A resist is applied onto the transparent conductive film. Then, the bottom face of the substrate is irradiated with light. As a result, the upper electrode can be patterned in a self-aligned manner with the gate wiring. Instead of this method, the transparent electrode may be formed by independently forming a pattern mask on the transparent conductive film so as to perform patterning after depositing the transparent conductive film.

A method as described above for performing exposure from the bottom face of the substrate using a gate wiring as a mask is disclosed in Japanese Laid-Open Patent Publication No. 5-53139. In this patent publication, a silicide electrode serving as a storage capacitor electrode is formed by exposure from the bottom face so as to form a storage capacitor in a portion of the silicide electrode overlapping with the pixel electrode. Therefore, this method completely differs from that of the invention which intends to constitute a storage capacitor by using a gate wiring, a transparent insulating film and a transparent electrode.

As the transparent insulating film constituting the storage capacitor, an insulating film made of $SiO_2$ can be independently formed. However, an anodic oxide film of a gate wiring, which has been conventionally necessary to improve the reliability of the gate wiring, may also be used as a dielectric of the storage capacitor. In this case, since a step for forming a film such as an $SiO_2$ film which was necessary for forming the storage capacitor can be omitted, the fabrication step can be simplified.

As a material of the gate wiring, Ta, Al, an Al alloy, W, refractory metal silicide, a layered structure of silicide-silicon and the like can be used. With some of the materials listed above, the reliability of the insulation property of the wiring can be enhanced without forming the anodic oxide film on the surface thereof. A metal material containing Al as a main component such as pure-Al or an Al alloy is preferred because a specific resistance of the wiring can be set at 10 $\mu\Omega$cm or lower.

In the case where the metal material containing Al as a main component is used as a gate wiring and the anodic oxide film is used as a dielectric of the storage capacitor, it is preferable to use an Al alloy containing at least one of Ti, Dy, Nd, Fe, Co and Gd in view of the wiring resistance and the dielectric strength. Since these Al alloys have excellent characteristics in the specific resistance of the wiring, the dielectric strength of the anodic oxide film, and the hillock resistance, they are suitable as materials of the gate wiring. In particular, Al—Ti or an Al alloy containing a rare earth metal such as Dy or Nd, i.e., Al—Dy or Al—Nd, is preferred.

Table 1 shows the result of the experiment carried out by the inventors of the present invention regarding the dielectric strength of an anodic oxide film made of each of the Al alloys. As shown in Table 1, it is made clear that the dielectric strengths of Al—Ti, Al—Dy and Al—Nd are higher than those of the other Al alloys.

TABLE 1

| Type of alloy | Dielectric strength (V) |
| --- | --- |
| pure-Al | 33 |
| Al-Ti (0.5 at %) | 80 |
| Al-Nd (1 at %) | 84 |
| Al-Dy (1 at %) | 85 |
| Al-Si (2 at %) | 15 |
| Al-Ta (2 at %) | 52 |
| Al-Fe (2 at %) | 51 |
| Al-Co (2 at %) | 50 |
| Al-Gd (2 at %) | 58 |

Table 2 shows a specific resistance of each of the Al alloys before and after annealing. As shown in Table 2, it is understood that specific resistances of an Al—Dy alloy, an Al—Nd alloy, an Al—Fe alloy, an Al—Co alloy and an Al—Gd alloy which are used as materials of the gate wiring can be lowered to be halved or less by annealing at 300° C.

TABLE 2

| Type of alloy | Specific resistance before annealing (μΩcm) | Specific resistance after annealing (μΩcm) |
| --- | --- | --- |
| pure-Al | 2.9 | 2.8 |
| Al-Ti (0.5 at %) | 8.1 | 7.3 |
| Al-Nd (1 at %) | 10.1 | 4.9 |
| Al-Dy (1 at %) | 11.4 | 5.1 |
| Al-Si (2 at %) | 5.9 | 4.9 |
| Al-Ta (2 at %) | 21.3 | 12.2 |
| Al-Fe (2 at %) | 16.9 | 5.9 |
| Al-Co (2 at %) | 13.5 | 4.8 |
| Al-Gd (2 at %) | 16.1 | 5.2 |

Table 3 shows a hillock resistance of a gate wiring made of each of the alloys on which an anodic oxide film is formed. The mark O indicates that a hillock is scarcely observed through an optical microscope after thermal treatment, while the mark X indicates that the occurrence of a hillock is remarkable in the observation through an optical microscope.

Figure 10:
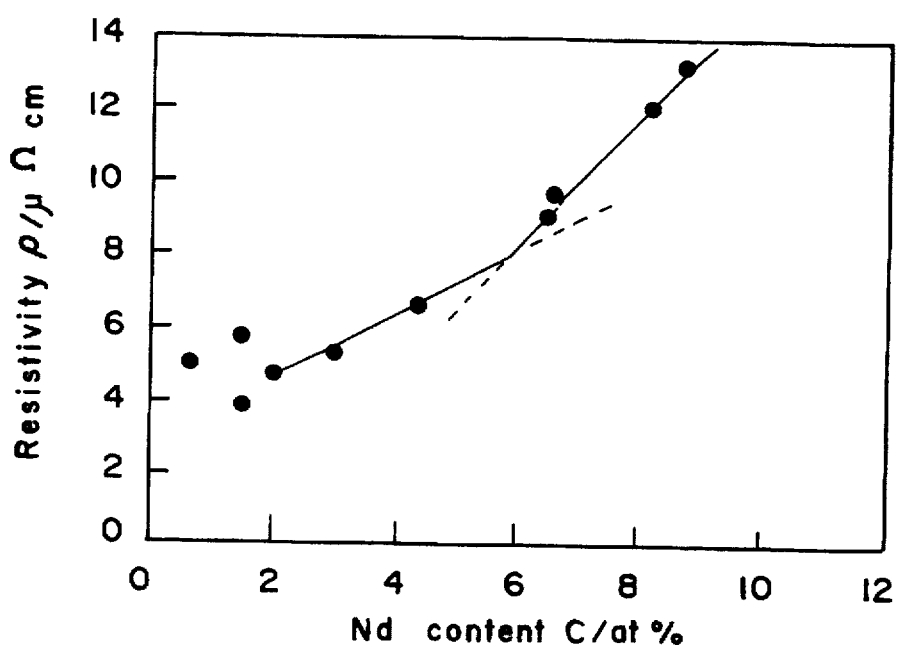
FIG. 10 is a graph showing the relationship between a specific resistance of Al—Nd and Nd concentration.

As can be understood from Table 3, pure Al has a poor hillock resistance as a material for the gate wiring, while an alloy Al—Dy and an alloy Al—Nd alloy have an excellent hillock resistance. The hillock resistance increases as the addition amount of impurity increases. However, the specific resistance disadvantageously increases simultaneously. For example, the dependence of the specific resistance of the Al—Nd alloy on an Nd concentration (after a thermal treatment at 300° C. for one hour) is shown in FIG. 10. In order to limit the specific resistance to 10 μΩcm or lower in the case where the Al—Nd alloy is used as a material of the gate wiring, it is preferred that a concentration of Nd to be added is set in the range of 1 to 6 at % as shown in FIG. 10.

TABLE 3

| Type of alloy | Thermal treatment temperature (one hour) | | | | | | |
| --- | --- | --- | --- | --- | --- | --- | --- |
| | 100° C. | 150° C. | 200° C. | 350° C. | 400° C. | 450° C. | 500° C. |
| pure-Al | O | X | | | | | |
| Al—Ti (0.5 at %) | | | | | O | X | |
| Al—Nd (1 at %) | | | | | | O | X |
| Al—Dy (1 at %) | | | | | | O | X |
| Al—Ta (2 at %) | | | | | O | X | |
| Al—Fe (2 at %) | | | | | O | X | |
| Al—Co (2 at %) | | | | O | X | | |
| Al—Gd (2 at %) | | | | | | O | X |

Since a storage capacitor is formed by using the gate wiring as a lower electrode, it is not necessary to independently form a lower electrode. Moreover, an upper insulating film is formed on a transparent electrode, and a further electrode (a pixel electrode in the case where the semiconductor device is used in a liquid crystal display apparatus) is formed on the upper insulating film. Since the further electrode is not used as an upper electrode constituting the storage capacitor, it is not necessary to take an alignment margin into consideration.

In the case where a semiconductor apparatus according to the present invention is applied to an active-matrix substrate of a liquid crystal display apparatus, a plurality of switching elements and pixel electrodes are formed in a matrix so that a gate wiring for controlling the switching element and a gate wiring for supplying a data signal to the switching element intersect each other. A transparent electrode is formed on the gate wiring so as to interpose a transparent insulating film therebetween to form a storage capacitor. An upper insulating film is formed on the transparent electrode, and a pixel electrode is formed on the upper insulating film. The transparent electrode is electrically connected to the pixel electrode via a contact hole formed through the upper insulating film.

Hereinafter, more specific examples of the present invention will be described with reference to the drawings. In the drawings, the components having the same functions are denoted by the same reference numerals.

EXAMPLE 1

FIG. 1 is a plan view showing an active-matrix substrate according to Example 1. In FIG. 1, an insulating film of a storage capacitor, an interlayer insulating film and a passivation film are omitted for simplification.

An active-matrix substrate includes TFTs 31 serving as switching elements, storage capacitors 32 for holding a voltage applied to a display medium, and pixel electrodes 23 for applying a voltage to the display medium, which are formed in matrix. A gate wiring 6 and a source wiring 17 are formed so as to cross each other. In FIG. 1, adjacent pixel electrodes 23 are denoted by the reference numerals 23m and 23m-1, and adjacent gate wirings 6 are denoted by the reference numerals 6m and 6m-1. The TFT 31 is formed in the vicinity of the intersecting point of the gate wiring 6 and the source wiring 17. The gate wiring 6 is connected to a gate electrode of the TFT 31. In response to a signal input to the gate wiring 6, the TFT 31 is driven. The source wiring 17 is connected to a source region 8 of the TFT 31. A video signal is input to the source wiring 17. The pixel electrode 23m is connected to the gate wiring 6m through the switching element 31. The pixel electrode 23m-1 is connected to the gate wiring 6m-1 through the switching element 31.

A storage capacitor 32 is formed by using an overlapping portion of the gate wiring 6, an insulating film (not shown) formed on the gate wiring 6, and the transparent electrode 11. A pixel electrode 23 is formed on a passivation electrode (not shown) formed above the transparent film 11, and is connected to the transparent electrode 11 through a storage capacitor connection electrode 19. More particularly, the storage capacitor 32 corresponding to the pixel electrode 23m is constituted by using a structure including the gate wiring 6m-1 in front of the pixel electrode 23m, the insulating film formed on the gate wiring 6m-1 and the transparent electrode 11.

The fabrication process of the active-matrix substrate will be described with reference to FIGS. 2A to 2E, 3A to 3H and 4A to 4H. FIGS. 2A to 2E are plan views showing a main part of the active-matrix substrate in FIG. 1. FIGS. 3A to 3H are cross-sectional views, taken along a line 3a—3a in FIG. 1, and FIGS. 4A to 4H are cross-sectional views, taken along a line 4a—4a in FIG. 1.

Figure 2A:
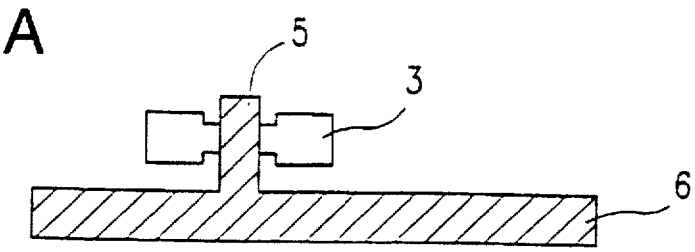
FIGS. 2A to 2E are plan views showing the respective fabrication steps of the active-matrix substrate of Example 1.
Figure 2B:
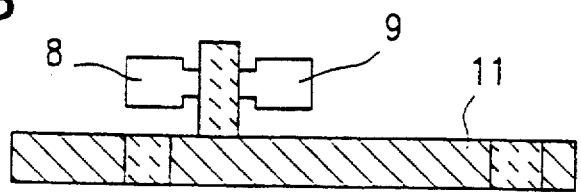
Figure 2C:
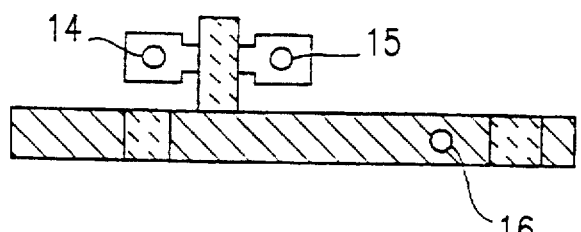
Figure 3A:
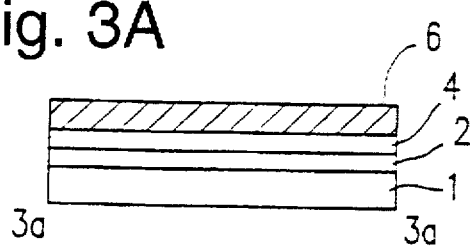
FIGS. 3A to 3H are cross-sectional views showing the fabrication steps of the active-matrix substrate, taken along a line 3a—3a in FIG. 1.
Figure 3F:
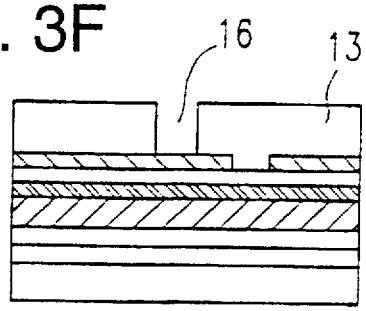
Figure 3B:
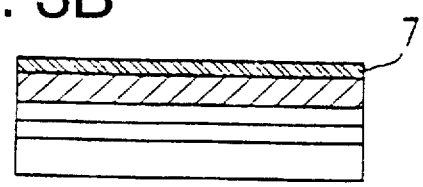
Figure 4A:
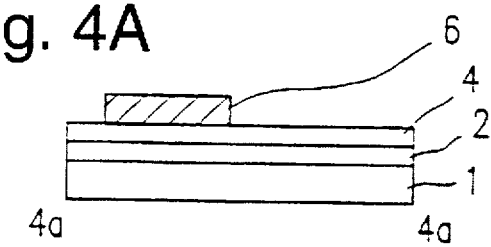
FIGS. 4A to 4H are cross-sectional views showing the fabrication steps of the active-matrix substrate, taken along a line 4a—4a in FIG. 1.
Figure 4F:
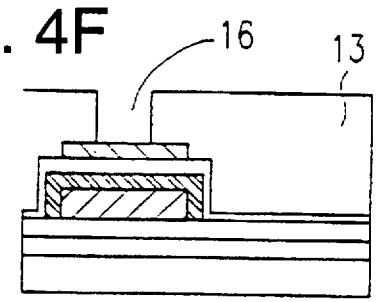
Figure 4B:
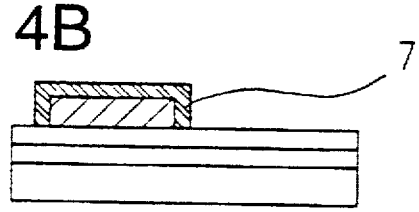

First, an $SiO_2$ film is deposited to a thickness of 100 nm on a transparent insulating substrate 1 such as a glass substrate so as to prevent impurities from being diffused from the substrate, thereby forming a base coat film 2. A silicon film is formed to a thickness of 50 nm on the base coat film 2 so as to form a semiconductor island 3. Then, an $SiO_2$ film is formed to a thickness of 100 nm on the semiconductor island 3 so as to form a gate insulating film 4. An Al—Ti alloy (Ti: 1 wt %) film is formed on the gate insulating film 4 by sputtering. Then, patterning of the Al—Ti film is performed so as to form a gate electrode 5 and a gate wiring 6 (FIGS. 2A, 3A and 4A).

Next, in order to improve the reliability and the insulating property of the gate electrode 5 and the gate wiring 6, the gate electrode 5 and the gate wiring 6 are immersed into a mixture of tartaric acid ammonium and ethylene glycol while applying a voltage of 80 V so as to anodize the surfaces of the gate electrode 5 and the gate wiring 6. As a result, an anodic oxide film 7 made of $Al_2O_3$ (preferably having a thickness in the range of about 50 nm to about 200 nm) is formed (see FIGS. 3B and 4B).

Subsequently, $n^+$ ion implantation is performed in a $PH_3+H_2$ gas with an acceleration voltage of 80 keV and a dose amount of $5 \times 10^{15}/cm^2$ so as to form a source region 8 and a drain region 9. Laser irradiation is performed at 350 $mj/cm^2$ in a room-temperature atmosphere by using an Xe—Cl excimer laser. In the case where a p-type region is intended to be formed, p-type ions such as boron are implanted.

Figure 3G:
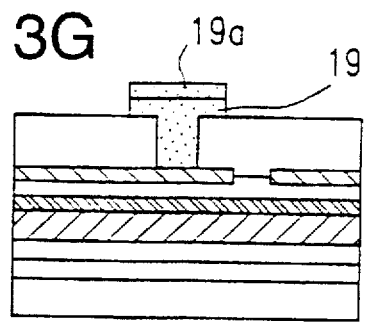
Figure 3C:
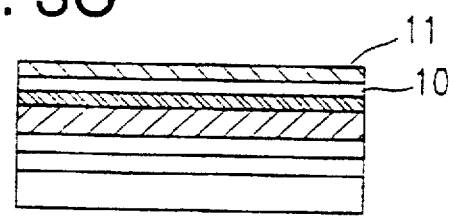
Figure 3H:
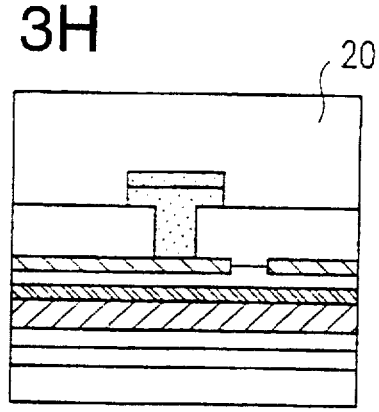
Figure 3D:
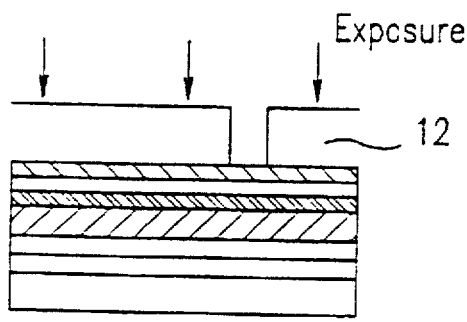
Figure 3E:
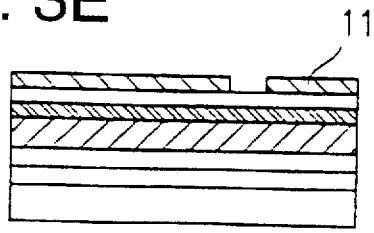
Figure 4G:
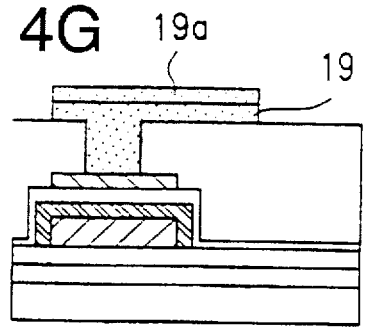
Figure 4C:
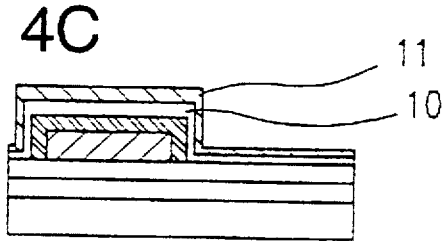
Figure 4H:
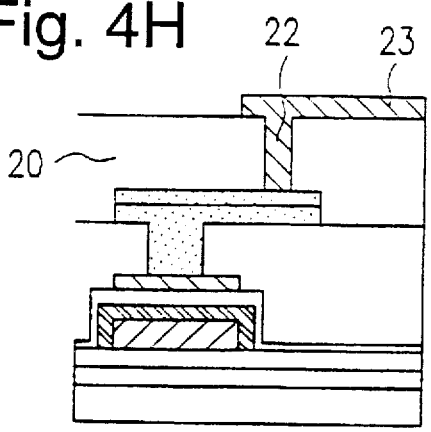
Figure 4D:
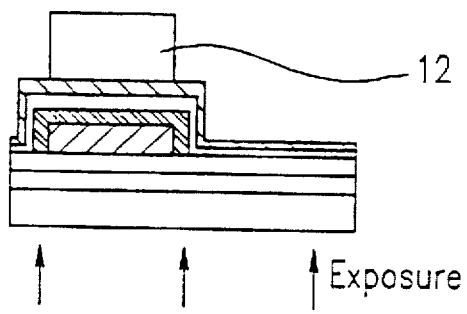
Figure 4E:
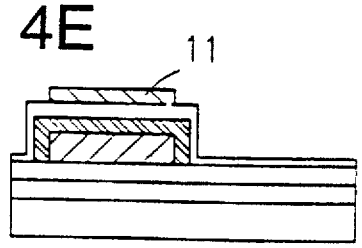

On the source region 8 and the drain region 9, an $SiO_2$ film is deposited to a thickness of 100 nm by a chemical vapor deposition (CVD) method to form an insulating film 10 of a storage capacitor. In this case, a dielectric of the storage capacitor is formed by using the anodic oxide film 7 and the insulating film 10. A total thickness of the dielectric is in the range of about 150 nm to about 300 nm. An ITO film 11 is deposited on the insulating film 10 to a thickness of 100 nm so as to form an upper electrode of a storage capacitor (FIGS. 3C and 4C).

Next, a photolithography process is performed. More specifically, a positive resist is applied onto the surface of the layered structure on the substrate. Then, light is radiated onto the bottom face of the substrate. As a result, part of the resist is exposed to light while using the gate wiring 6 as the mask. Subsequently, in order to separate the ITO upper electrode 11 for each element, the exposure is performed from the surface of the substrate by using a photomask (not shown). The exposure from the bottom face of the substrate and the exposure from the surface of the substrate can be successively performed. By performing development at a time, a resist pattern 12 is formed on the gate wiring (see FIGS. 3D and 4D).

Thereafter, the ITO film 11 is etched by using the resist pattern 12 as a mask. The etching may be either wet etching using HBr or dry etching, and any known method can be used. As a result, the upper electrode 11 is formed in a self-aligned manner so as to overlap the gate wiring 6 (see FIGS. 2B, 3E and 4E).

Next, an $SiO_2$ film is deposited on the upper electrode 11 to a thickness of 500 nm so as to form an interlayer insulating film 13. Then, a contact hole 14 for a source wiring, a contact hole 15 for a drain electrode, a contact hole for a gate wiring (not shown) and a contact hole 16 for a storage capacitor are formed through the interlayer insulating film 13 (see FIGS. 2C, 3F and 4F).

Figure 2D:
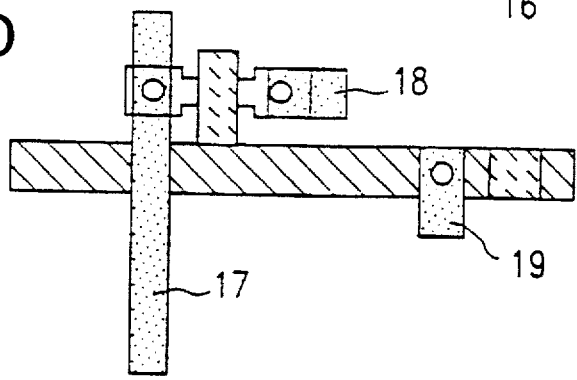
Figure 2E:
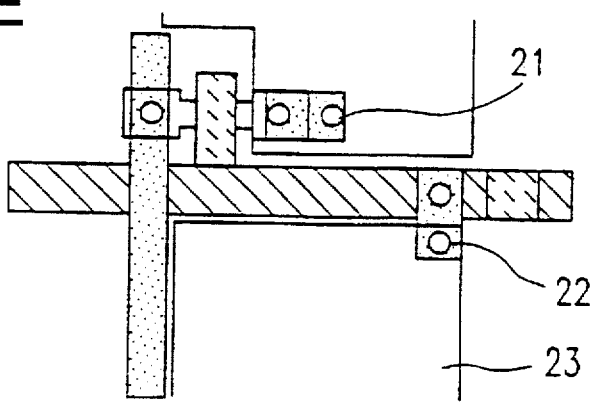

Subsequently, an Al—Ti film having a thickness of 500 nm and an TiN film 19a having a thickness of 100 nm are deposited in this order by sputtering as a metal wiring so as to form a source wiring 17, a drain electrode 18 and a storage capacitor connection electrode 19 (See FIGS. 2D, 3G and 4G).

Then, an SiN film having a thickness of 300 nm and a polyimide film having a thickness of 1.8 µm are deposited so as to form a passivation film 20. A contact hole 21 is formed above the drain electrode 18 while a contact hole 22 is formed above the connection electrode 19. As the final step, an ITO film is deposited to a thickness of 100 nm. Then, the ITO film is patterned, thereby forming the pixel electrode 23 (see FIGS. 2E, 3H and 4H).

Since the storage capacitor is formed by using the gate wiring as the lower electrode in the thus obtained active-matrix substrate of Example 1, it is not necessary to independently form a lower electrode. Therefore, an aperture ratio is not lowered. Moreover, since the pixel electrode does not serve as an upper electrode of the storage capacitor, it is not necessary to take the alignment margin into consideration. Since the interlayer insulating film is not used as a dielectric of the storage capacitor, the insulating film can be formed so as to have a desired thickness to reduce the area of the storage capacitor. Since the transparent electrode is patterned by performing the exposure from the bottom face of the substrate by using the gate wiring as a mask, the upper electrode of the storage capacitor can be formed in a self-aligned manner on the gate wiring. Furthermore, the aperture ratio can be improved. Moreover, since an Al—Ti alloy is used as a material of the gate wiring, it is possible to set the specific resistance of the wiring at 10 µΩcm or lower so as to lower the wiring resistance. In addition, the dielectric strength of the anodic oxide film can be made higher than the case where pure Al is used.

In the above description, as shown in FIG. 1, a gate wiring 6m-1 in front of the pixel electrode 23m is used as a lower electrode of the storage capacitor 32 corresponding to the pixel electrode 23m.

In the above description, the insulating substrate, the dielectric layer of the storage capacitor and the upper electrode are transparent. Even if the material used for forming these constituting elements is not transparent, a satisfactory effect of the present invention can be obtained from the storage capacitor formed of a non-transparent material. In such a case, the upper electrode is formed by exposure from the surface of the substrate by using known photolithography.

EXAMPLE 2

In Example 2, an active-matrix substrate is fabricated by using the anodic oxide film of the gate wiring as a dielectric of the storage capacitor.

The fabrication process of the active-matrix substrate of Example 2 is described with reference to FIGS. 5A to 5E, 6A to 6H and 7A to 7H. FIGS. 5A to 5E are plan views showing the main part of the active-matrix substrate, FIGS. 6A to 6H are cross-sectional views taken along a line 6a—6a in FIG. 5E, and FIGS. 7A to 7H are cross-sectional views taken along a line 7a—7a in FIG. 5E.

Figure 5A:
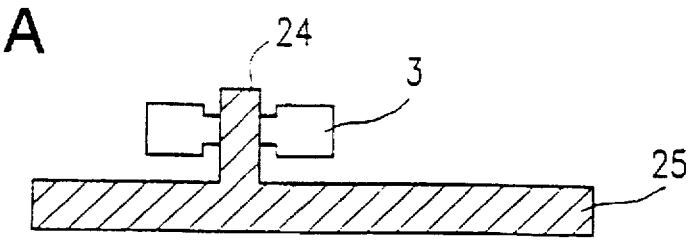
FIGS. 5A to 5E are plan views showing the respective fabrication steps of an active-matrix substrate of Example 2.
Figure 5B:
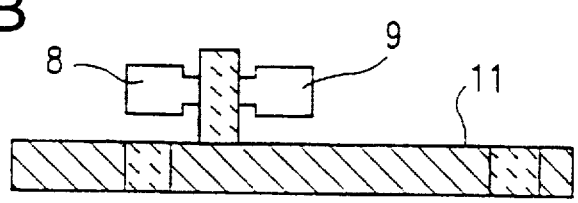
Figure 5C:
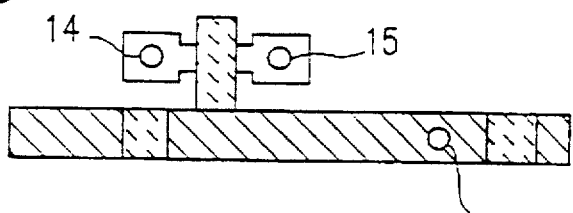
Figure 6A:
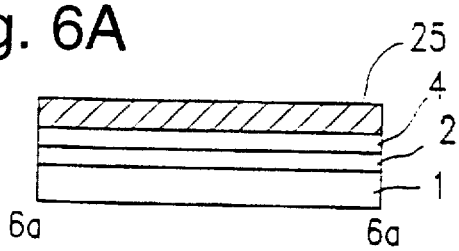
FIGS. 6A to 6H are cross-sectional views showing the fabrication steps of the active-matrix substrate, taken along a line 6a—6a in FIG. 5E.
Figure 6B:
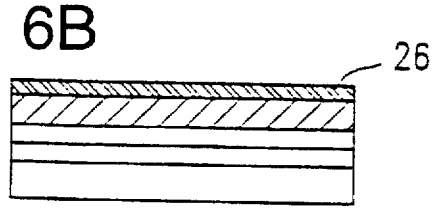
Figure 6C:
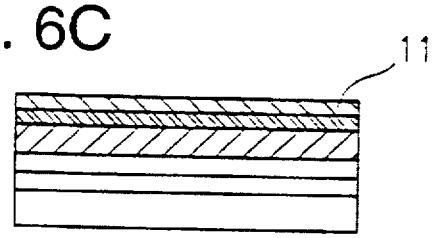
Figure 6D:
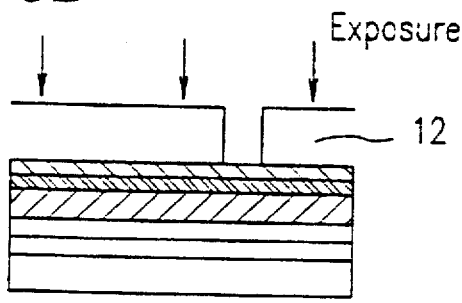
Figure 6E:
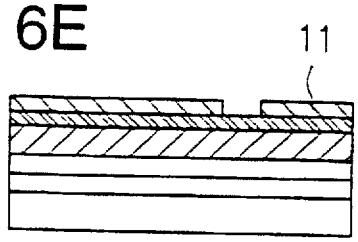
Figure 6F:
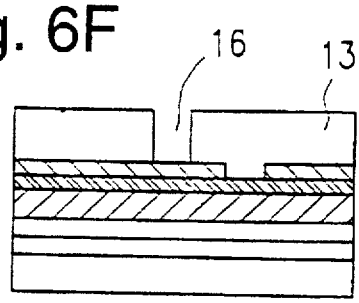
Figure 7A:
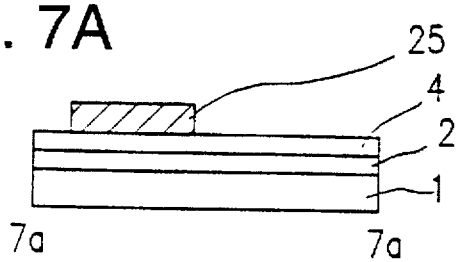
FIGS. 7A to 7H are cross-sectional views showing the fabrication steps of the active-matrix substrate, taken along a line 7a—7a in FIG. 5E.
Figure 7F:
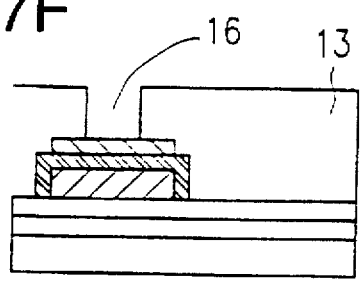
Figure 7B:
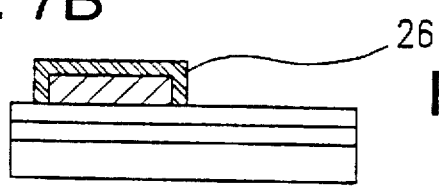

First, an $SiO_2$ film is deposited to a thickness of 100 nm on the transparent insulating substrate 1 such as a glass substrate so as to prevent impurities from being diffused from the substrate, thereby forming the base coat film 2. A silicon film is formed to a thickness of 50 nm on the base coat film 2 so as to form the semiconductor island 3. Then, an $SiO_2$ film is formed to a thickness of 100 nm on the semiconductor island 3 so as to form a gate insulating film 4. An Al—Nd alloy (Nd: 1 at %) film is formed to a thickness of 350 nm on the gate insulating film 4 by sputtering. Then, patterning of the Al—Ti film is performed so as to form a gate electrode 24 and a gate wiring 25 (FIGS. 5A, 6A and 7A).

Next, in order to improve the reliability and the insulating property of the gate electrode 24 and the gate wiring 25, the gate electrode 24 and the gate wiring 25 are immersed into a mixture of tartaric acid ammonium and ethylene glycol while applying a voltage of 100 V so as to anodize the surfaces of the gate electrode 24 and the gate wiring 25. As a result, an anodic oxide film 26 made of $Al_2O_3$ (preferably having a thickness in the range of about 50 nm to 200 nm) is formed (see FIGS. 6B and 7B).

Subsequently, $n^+$ ion implantation is performed in a $PH_3+H_2$ gas with an acceleration voltage of 80 keV and a dose amount of $5 \times 10^{15}/cm^2$ so as to form the source region 8 and the drain region 9. Laser irradiation is performed at 350 mj/$cm^2$ in a room-temperature atmosphere by using an Xe—Cl excimer laser. On the source region 8 and the drain region 9, the ITO film 11 is formed to a thickness of 100 nm to form an upper electrode of the storage capacitor (see FIG. 6C and 7C).

Next, a photolithography process is performed. More specifically, a positive resist is applied on the surface of the layered structure on the substrate. Then, light is radiated onto the bottom face of the substrate. As a result, part of the resist is exposed to light while using the gate wiring 6 as the mask. Subsequently, in order to separate the ITO upper electrode 11 for each element, the exposure is performed from the surface of the substrate by using a photomask (not shown). The exposure from the bottom face of the substrate and the exposure from the surface of the substrate can be successively performed. By performing development at a time, a resist pattern 12 is formed on the gate wiring (see FIGS. 6D and 7D).

Thereafter, the ITO film 11 is etched by using the resist pattern 12 as a mask. The etching may be either wet etching using HBr or dry etching, and any known method can be used. As a result, the upper electrode 11 is formed in a self-aligned manner so as to overlap the gate wiring 25 (see FIGS. 5B, 6E and 7E).

Next, an $SiO_2$ film is deposited on the upper electrode 11 to a thickness of 500 nm by CVD so as to form the interlayer insulating film 13. Then, the contact hole 14 for a source wiring, the contact hole 15 for a drain electrode, the contact hole for a gate wiring (not shown) and the contact hole 16 for a storage capacitor are formed through the interlayer insulating film 13 (see FIGS. 5C, 6F and 7F).

Figure 5D:
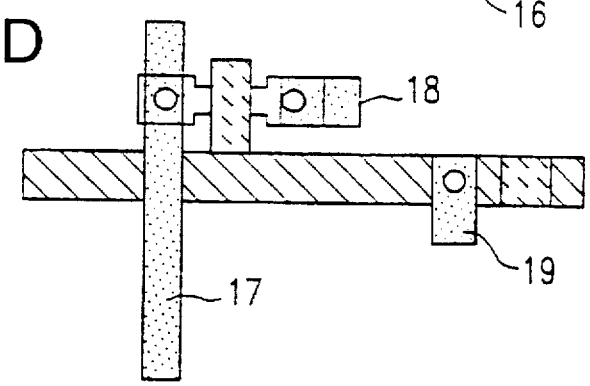
Figure 5E:
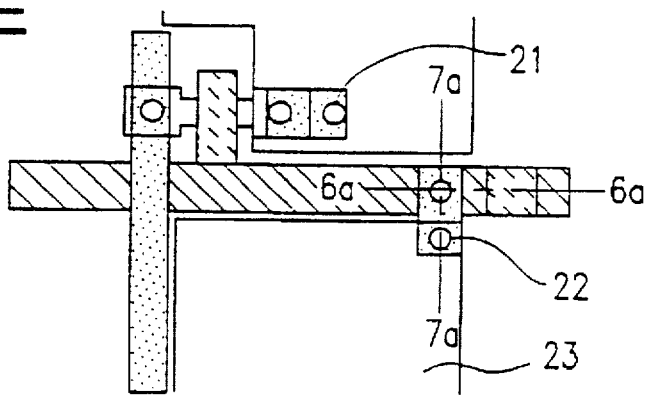
Figure 6G:
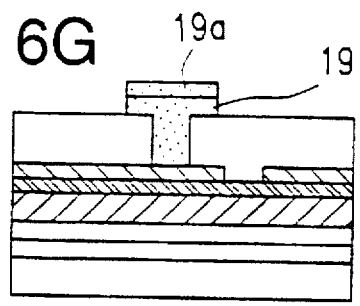
Figure 6H:
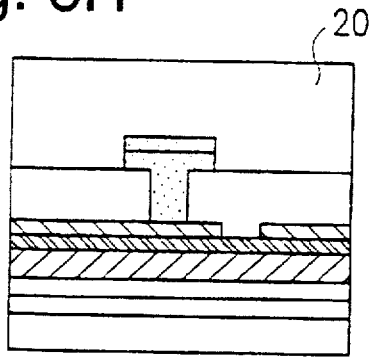
Figure 7G:
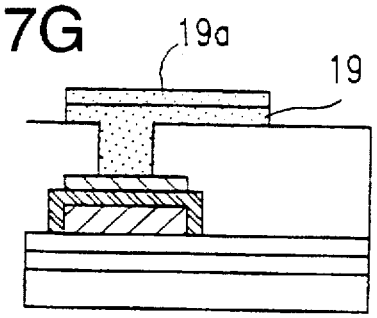
Figure 7C:
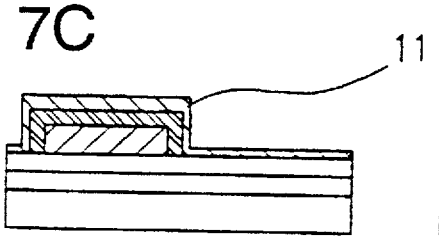
Figure 7H:
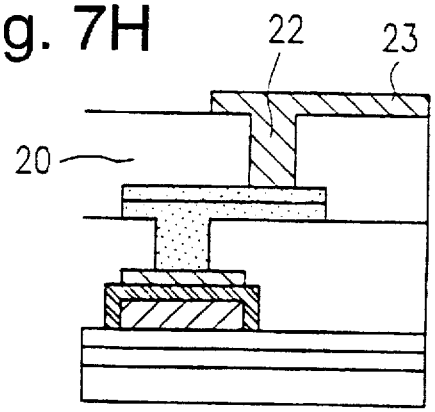
Figure 7D:
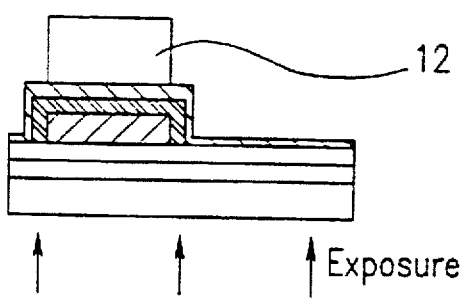
Figure 7E:
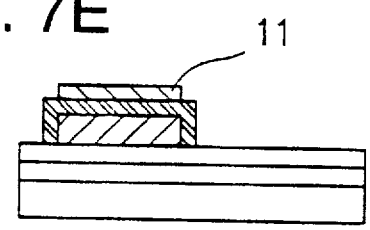
Figure 8:
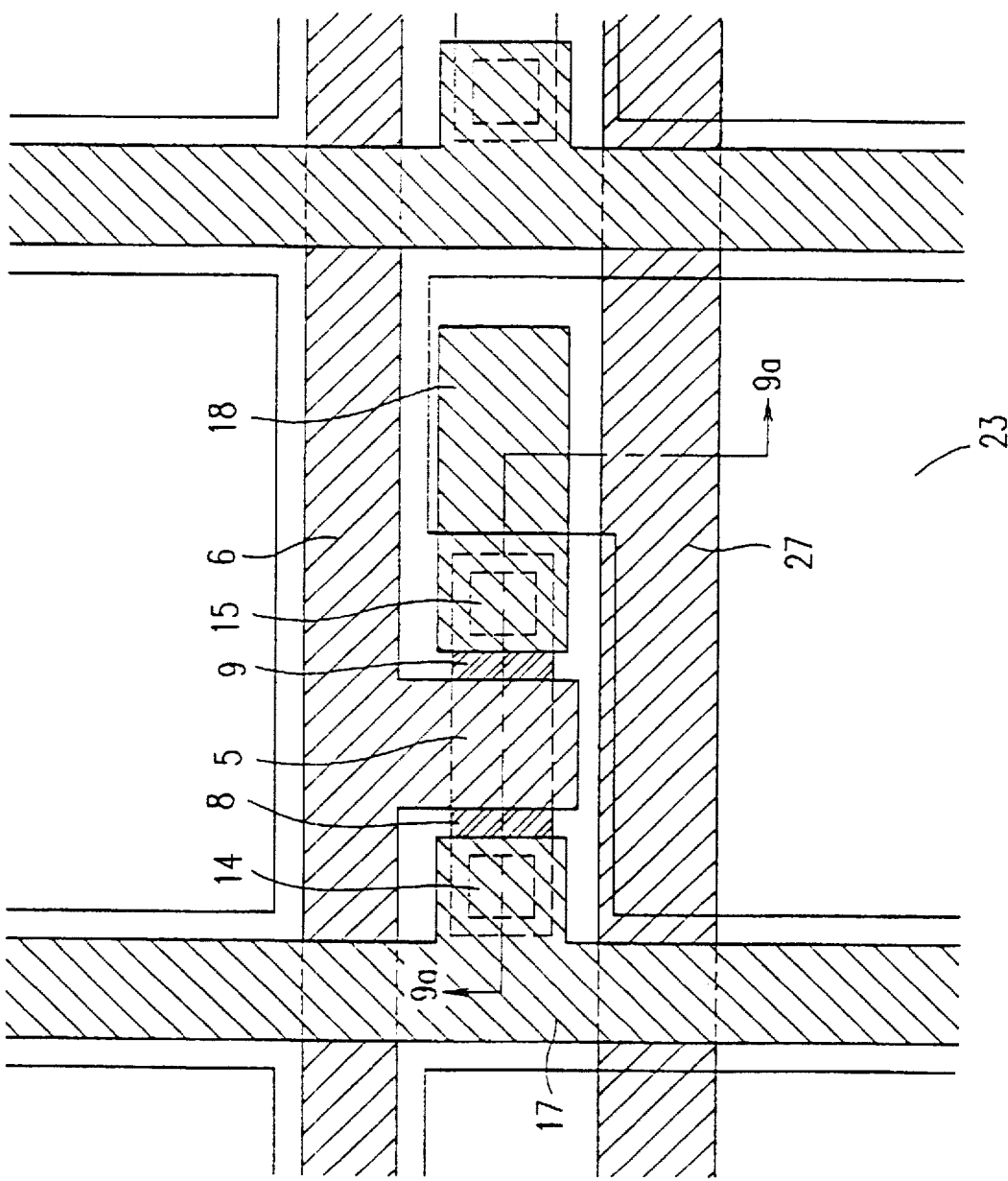
FIG. 8 is a plan view showing a conventional semiconductor apparatus.
Figure 9:
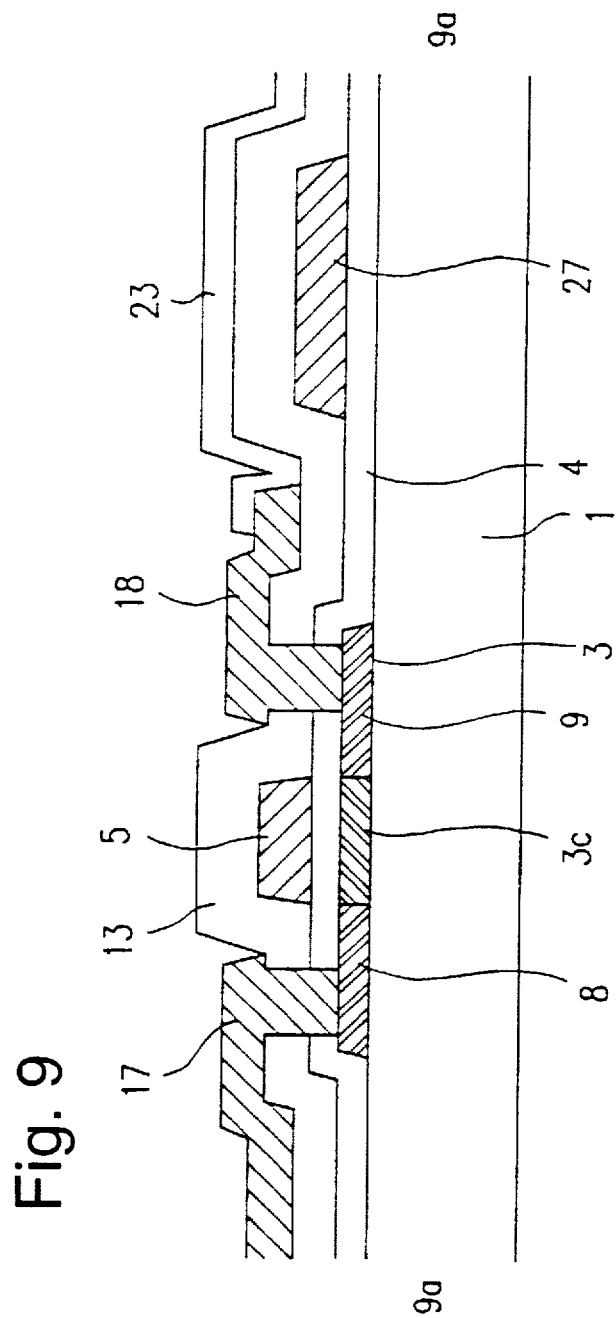
FIG. 9 is a cross-sectional view showing a conventional semiconductor apparatus.

Subsequently, a Al—Ti film having a thickness of 500 nm and the TiN film 19a having a thickness of 100 nm are deposited in this order by sputtering as a metal wiring so as to form the source wiring 17, the drain electrode 18 and the storage capacitor connection electrode 19 (See FIGS. 5D, 6G and 7G).

Then, an SiN film having a thickness of 300 nm and a polyimide film having a thickness of 1.8 μm are deposited so as to form a passivation film 20. The contact hole 21 is formed above the drain electrode 18, while the contact hole 22 is formed above the connection electrode 19. As the final step, an ITO film is deposited to a thickness of 100 nm. Then, the ITO film is patterned, thereby forming the pixel electrode 23 (see FIGS. 5E, 6H and 7H).

Since the storage capacitor is formed by using the gate wiring as the lower electrode in the thus obtained active-matrix substrate of Example 2, it is not necessary to independently form a lower electrode. Therefore, an aperture ratio is not lowered. Moreover, since the pixel electrode does not serve as an upper electrode of the storage capacitor, it is not necessary to take the alignment margin into consideration. Since the interlayer insulating film is not used as a dielectric of the storage capacitor, the insulating film can be formed so as to have a desired thickness to reduce the area of the storage capacitor. Since the transparent electrode is patterned by performing the exposure from the bottom face of the substrate by using the gate wiring as a mask, the upper electrode of the storage capacitor can be formed in a self-aligned manner on the gate wiring. Furthermore, the aperture ratio can be improved. Moreover, since an Al—Nd alloy (Nd: 1 at %) is used as a material of the gate wiring, it is possible to set the specific resistance of the wiring at 10 μΩcm or lower so as to lower the wiring resistance. In addition, the dielectric strength of the anodic oxide film can be made higher than the case where pure Al is used.

As is apparent from the above description, according to the present invention, since a storage capacitor is constituted by using a structure including a transparent electrode, the transparent insulating film and the gate wiring serving as the lower electrode, the aperture ratio can be improved. Since both of the dielectric and the upper electrode are transparent, the upper electrode of the storage capacitor can be formed on the gate wiring in a self-aligned manner by exposure from the bottom face of the substrate using the gate wiring as a mask so as to achieve the patterning. Thus, the aperture ratio can be further improved. Therefore, a liquid crystal display apparatus providing bright display which is not obtainable in the conventional liquid crystal display apparatus can not realized.

Moreover, by using the anodic oxide film of the gate wiring as the dielectric of the storage capacitor, the fabrication step can be simplified to improve the yield of the semiconductor device and to lower the fabrication cost.

If an Al alloy containing at least one of Ti, Dy, Nd, Fe, Co and Gd is used as a material of the gate wiring, it is possible to lower the specific resistance of the wiring and to increase the dielectric strength of the anodic oxide film. Thus, it is possible to obtain a semiconductor device having higher reliability and excellent characteristics. Therefore, the semiconductor device of the present invention is satisfactory for use in the liquid crystal display apparatus having a large display screen size and high precision.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device formed on an insulating substrate, comprising:

a gate wiring provided on the insulating substrate;

a first insulating film provided so as to cover the gate wiring;

an upper electrode formed so as to face the gate wiring in such a manner that the first insulating film is interposed therebetween;

a second insulating film provided so as to cover the upper electrode; and another electrode formed on the second insulating film, wherein the upper electrode is electrically connected to the another electrode via a contact hole formed through the second insulating film, a storage capacitor is formed of a structure including the upper electrode, the first insulating film, and the gate wiring opposing the upper electrode across the first insulating film, the upper electrode and the gate wiring have substantially the same width.

2. A semiconductor device according to claim 1, wherein the insulating substrate, the upper electrode and the first insulating film are transparent.

3. A semiconductor device according to claim 2, wherein the upper electrode is patterned by exposure from a bottom face of the substrate using the gate wiring as a mask.

4. A semiconductor device according to claim 1, wherein the first insulating film has a thickness in the range of about 50 to about 200 nm.

5. A semiconductor device according to claim 1, wherein the first insulating film has a thickness in the range of about 50 to about 300 nm.

6. A semiconductor device according to claim 1, wherein a metal material for forming the gate wiring has a specific resistance of 10 µΩcm or less.

7. A semiconductor device according to claim 1, wherein the gate wiring is made of a metal material containing Al as a main component.

8. A semiconductor device according to claim 7, wherein the metal material containing Al as a main component contains at least one of Ti, Dy, Nd, Fe, Co and Gd.

9. A semiconductor device according to claim 1, wherein the first insulating film includes a film formed by anodizing a surface of the gate wiring.

10. An active matrix substrate comprising:
    an insulating substrate;
    a gate wiring provided on the insulating substrate;
    a source wiring intersecting the gate wiring;
    a pixel electrode for applying a voltage to a display medium, provided in the vicinity of an intersecting point of the gate wiring and the source wiring;
    a switching element electrically connected to the pixel electrode;
    a first insulating film provided so as to cover the gate wiring;
    an upper electrode formed so as to face the gate wiring in such a manner that the first insulating film is interposed therebetween; and
    a second insulating film formed so as to cover the upper electrode,
    wherein the upper electrode is electrically connected to the pixel electrode via a contact hole formed through the second insulating film,
    a storage capacitor for holding a voltage to be applied to the display medium is formed of a structure including the upper electrode, the first insulating film and the gate wiring opposing the upper electrode across the first insulating film, and
    the upper electrode and the gate wiring have substantially the same width.

11. An active-matrix substrate according to claim 10, wherein the first insulating film has a thickness in the range of about 50 nm to about 200 nm.

12. An active-matrix substrate according to claim 10, wherein the first insulating film has a thickness in the range of about 50 nm to about 300 nm.

13. An active-matrix substrate according to claim 10, wherein a metal material for forming the gate wiring has a specific resistance of 10 µΩcm or less.

14. An active-matrix substrate according to claim 10, wherein the gate wiring is made of a metal material containing Al as a main component.

15. An active-matrix substrate according to claim 14, wherein the metal material containing Al as a main component contains at least one of Ti, Dy, Nd, Fe, Co and Gd.

16. An active-matrix substrate according to claim 14, wherein the first insulating film includes a film formed by anodizing the surface of the gate wiring.

17. An active-matrix substrate comprising:
    an insulating substrate;
    a first gate wiring and a second gate wiring provided on the insulating substrate;
    a source wiring intersecting the first gate wiring and the second gate wiring;
    a pixel electrode for applying a voltage to a display medium, provided in the vicinity of an intersecting point of the first gate wiring and the source wiring between the first gate wiring and the second gate wiring;
    a switching element including a gate electrode connected to the first gate wiring, a source electrode connected to the source wiring, and a drain electrode electrically connected to the pixel electrode;
    a first insulating film provided so as to cover the second gate wiring;
    an upper electrode formed so as to face the second gate wiring in such a manner that the first insulating film is interposed therebetween; and
    a second insulating film provided so as to cover the upper electrode,
    wherein the upper electrode is electrically connected to the pixel electrode via a contact hole formed through the second insulating film,
    a storage capacitor for holding a voltage to be applied to the display medium is formed of a structure including the upper electrode, the first insulating film and the second gate wiring opposing the upper electrode across the first insulating film, and
    the upper electrode and the second gate wiring have substantially the same width.

18. A method for fabricating an active-matrix substrate including:
    a transparent insulating substrate;
    a gate wiring provided on the transparent insulating substrate;
    a source wiring intersecting the gate wiring;
    a pixel electrode for applying a voltage to a display medium, provided in the vicinity of an intersecting point of the gate wiring and the source wiring; and
    a switching element electrically connected to the pixel electrode,
    the method comprising the steps of:
    forming a first transparent film so as to cover the gate wiring;
    forming a transparent conductive film so as to cover the first transparent insulating film;
    patterning the transparent conductive film in a self-aligned manner with the gate wiring by photolithography using the gate wiring as a mask, thereby forming an upper electrode so as to face the gate wiring in such a manner that the first transparent insulating film is interposed therebetween;
    forming a second insulating film having a contact hole formed therethrough so as to cover the upper electrode; and
    forming the pixel electrode, which is electrically connected to the upper electrode via the contact hole formed through the second insulating film, on the second insulating film.

wherein a storage capacitor for holding a voltage to be applied to the display medium is formed of a structure including the upper electrode, the first transparent insulating film and the gate wiring opposing the upper electrode through the first transparent insulating film.

19. A method for forming an active-matrix substrate according to claim 18, wherein the first transparent film is formed by anodizing a surface of the gate wiring.

20. A method for forming an active-matrix substrate according to claim 18, wherein the first transparent film is formed so as to have a thickness in the range of about 50 nm to about 200 nm.

21. A method for forming an active-matrix substrate according to claim 18, wherein the first transparent film is formed so as to have a thickness in the range of about 50 nm to about 300 nm.

22. A method for forming an active-matrix substrate according to claim 18, wherein the gate wiring is made of a metal material containing Al as a main component.

23. A method for forming an active-matrix substrate according to claim 22, wherein the metal material containing Al as a main component contains at least one of Ti, Dy, Nd, Fe, Co and Gd.

* * * * *